(12) United States Patent
Curina et al.

(10) Patent No.: US 12,537,522 B2
(45) Date of Patent: Jan. 27, 2026

(54) ISOLATED DRIVER DEVICE, CORRESPONDING ELECTRONIC SYSTEM AND METHOD OF TRANSMITTING A DATA SIGNAL ACROSS A GALVANIC ISOLATION BARRIER

(71) Applicant: STMICROELECTRONICS S.r.l., Agrate Brianza (IT)

(72) Inventors: Carlo Curina, Bareggio (IT); Valerio Bendotti, Vilminore di Scalve (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 77 days.

(21) Appl. No.: 18/508,011

(22) Filed: Nov. 13, 2023

(65) Prior Publication Data
US 2024/0178835 A1 May 30, 2024

(30) Foreign Application Priority Data
Nov. 25, 2022 (IT) .................... 102022000024381

(51) Int. Cl.
*H03K 17/60* (2006.01)
*H03K 3/037* (2006.01)
*H03K 5/133* (2014.01)
*H03K 17/605* (2006.01)
*H03K 19/096* (2006.01)

(52) U.S. Cl.
CPC .......... *H03K 17/605* (2013.01); *H03K 3/037* (2013.01); *H03K 5/133* (2013.01); *H03K 19/096* (2013.01)

(58) Field of Classification Search
CPC ...... H03K 17/605; H03K 3/037; H03K 5/133; H03K 19/096; H03K 3/013; H03K 3/02335; H03K 17/6872; H03K 17/687; H03K 17/689; H03K 19/094; H04L 25/0266; H04L 25/0272; H04L 25/0268
See application file for complete search history.

(56) References Cited

U.S. PATENT DOCUMENTS

| 9,673,809 B1 | 6/2017 | Kandah et al. | |
| 2010/0329364 A1* | 12/2010 | Giombanco | H04L 7/0008 375/258 |
| 2011/0026612 A1 | 2/2011 | Lombardo et al. | |

OTHER PUBLICATIONS

Altoobaji et al., "A High Speed Fully Integrated Capacitive Digital Isolation System in 0.35 μM CMOS for Industrial Sensor Interfaces," 19th IEEE International New Circuits and Systems Conference (NEWCAS), 4 pages, 2021.

* cited by examiner

*Primary Examiner* — Jung Kim
(74) *Attorney, Agent, or Firm* — Seed Intellectual Property Law Group LLP

(57) ABSTRACT

In an electronic device, a pulse generator receives an input signal and a clock signal and produces a transmission signal that includes a pulse following each edge of the input signal and of the clock signal. The pulse is low when the input signal is low and high when the input signal is high. A transmitter produces, at its two output nodes, a replica of the transmission signal and the complement of the transmission signal. A galvanic isolation barrier is coupled to the output nodes of the transmitter and produces a differential signal that includes a positive spike at each rising edge of the transmission signal and a negative spike at each falling edge of the transmission signal.

13 Claims, 10 Drawing Sheets

ISOLATED DRIVER DEVICE, CORRESPONDING ELECTRONIC SYSTEM AND METHOD OF TRANSMITTING A DATA SIGNAL ACROSS A GALVANIC ISOLATION BARRIER

BACKGROUND

Technical Field

The description relates to isolated gate driver devices, which may be applied, for instance, in traction inverters, DC/DC converters, on-board chargers (OBC), and belt starter generators (BSG) for electric vehicles (EV) and hybrid electric vehicles (HEV).

Description of the Related Art

Conventional isolated gate driver devices include two semiconductor dies arranged in the same package: a low voltage die that usually exchanges signals with a microcontroller, and a high voltage die that includes the driver circuit. The low voltage die and the high voltage die are electrically isolated one from the other by a galvanic isolation barrier, which usually includes one or more high-voltage capacitors (HVCap) arranged between the two dies.

FIG. 1 is a circuit block diagram exemplary of an isolated gate driver device. FIGS. 2 and 3 are time diagrams including waveforms exemplary of signals in the isolated gate driver device of FIG. 1, which illustrate possible operation of the gate driver device.

As exemplified in FIG. 1, an isolated gate driver device 10 includes a low-voltage semiconductor die 10a and a high-voltage semiconductor die 10b arranged in the same package. A bidirectional communication channel is provided in the device 10, so that a (single-ended) input signal $tx\_com_{LV}$ (also referred to as low-voltage transmission signal, e.g., a pulse-width modulated signal having a frequency between 15 kHz and 5 MHz received from a microcontroller) received at an input pin 101a of the low-voltage die 10a can be propagated as a (single-ended) output signal $rx\_com_{HV}$ (also referred to as high-voltage reception signal) transmitted by an output pin 106b of the high-voltage die 10b, and a (single-ended) input signal $tx\_com_{HV}$ (also referred to as high-voltage transmission signal) received at an input pin 101b of the high-voltage die 10b can be propagated as a (single-ended) output signal $rx\_com_{LV}$ (also referred to as low-voltage reception signal) transmitted by an output pin 106a of the low-voltage die 10a.

In particular, the low-voltage die 10a includes a transmitter circuit 102a coupled to the input pin 101a and configured to convert the received single-ended signal $tx\_com_{LV}$ into a pair of differential (pulse-width modulated) signals $com\_p_{LV}$. For instance, signal $com\_p_{LV}$ may be generated at the output of a buffer circuit that receives signal $tx\_com_{LV}$ at input, and signal $com\_n_{LV}$ may be generated at the output of another buffer circuit that receives the complement (e.g., an inverted replica) of signal $tx\_com_{LV}$ at input (i.e., an inverting buffer). The low-voltage die 10a further includes a first high-voltage capacitor 103P (e.g., an isolation capacitor) having a first terminal coupled to the first output of the transmitter circuit 102a to receive signal $com\_p_{LV}$, and a second high-voltage capacitor 103N (e.g., an isolation capacitor) having a first terminal coupled to the second output of the transmitter circuit 102a to receive signal $com\_n_{LV}$. The second terminals of the capacitors 103P and 103N provide the output nodes of the low voltage die 10a, which are connected (e.g., via bonding wires) to the input nodes of the high-voltage die 10b. The signals $com\_p_{LV}$, $com\_n_{LV}$ are filtered by the isolation capacitors 103P, 103N so that a pulsed differential signal $Vd_{HV}$ reaches the high-voltage die 10b. The differential signal $Vd_{HV}$ includes a train of pulses or spikes (positive and negative) corresponding to the edges (rising and falling, respectively) of signal $tx\_com_{LV}$, as exemplified in FIG. 3. The high-voltage die 10b includes a receiver circuit 104b coupled to the input nodes of the die 10b to receive the differential signal $Vd_{HV}$, and configured to produce the reconstructed (pulse-width modulated) signal $rx\_com_{HV}$ as a function of the received differential signal $Vd_{HV}$. For instance, the receiver circuit 104b may be configured to set the signal $rx\_com_{HV}$ to a high logic value ('1') as a result of a positive pulse being detected in the differential signal $Vd_{HV}$, and to a low logic value ('0') as a result of a negative pulse being detected in the differential signal $Vd_{HV}$, as exemplified in FIG. 3. Therefore, the reconstructed signal $rx\_com_{HV}$ may substantially correspond to a (slightly) delayed copy of the transmitted signal $tx\_com_{LV}$, as exemplified in FIGS. 2 and 3. The high-voltage die 10b may further include a driver stage including a pre-driver circuit configured to receive the reconstructed signal $rx\_com_{HV}$ and drive an output switching circuit as a function thereof. For instance, the output switching circuit may include a half-bridge driving stage.

The description of the low-voltage to high-voltage part of the communication channel provided above applies almost identically to the high-voltage to low-voltage part of the communication channel of the device 10. Indeed, the two parts of the bidirectional communication channel are almost symmetrical, with the difference that the isolation capacitors 103P, 103N are conventionally implemented in the low-voltage die 10a. Therefore, the high-voltage die 10b includes a transmitter circuit 102b coupled to the input pin 101b and configured (similarly to circuit 102a) to convert the received single-ended signal $tx\_com_{HV}$ into a pair of differential (pulse-width modulated) signals $com\_p_{HV}$, $com\_n_{HV}$. The signals $com\_p_{HV}$, $com\_n_{HV}$ are filtered by the isolation capacitors 103P, 103N so that a pulsed differential signal $Vd_{LV}$ reaches the low-voltage die 10a. The differential signal $Vd_{LV}$ includes a train of pulses corresponding to the edges of signal $tx\_com_{HV}$. The low-voltage die 10a includes a receiver circuit 104a coupled to the isolation capacitors to receive the differential signal $Vd_{LV}$, and configured (similarly to circuit 104b) to produce the reconstructed (pulse-width modulated) signal $rx\_com_{LV}$ as a function of the received differential signal $Vd_{LV}$. Therefore, the reconstructed signal $rx\_com_{LV}$ may substantially correspond to a (slightly) delayed copy of the transmitted signal $tx\_com_{HV}$.

Since the bidirectional communication channel shares the same conductors (e.g., bonding wires between dies 10a and 10b) as well as the same isolation capacitors 103P and 103N, communication is driven (e.g., managed) by a pair of disable signals $com\_dis_{LV}$ and $com\_dis_{HV}$ (also generally indicated herein as com_dis). In particular, signal $com\_dis_{LV}$ is received by the transmitter circuit 102a and the receiver circuit 104a of the low-voltage die 10a, and signal $com\_dis_{HV}$ is received by the transmitter circuit 102b and the receiver circuit 104b of the high-voltage die 10b. Generally, if a disable signal com_dis is de-asserted (e.g., low, com_dis='0'), the respective transmitter circuit 102 is enabled and the respective receiver circuit 104 is set to a high-impedance state; if a disable signal com_dis is asserted (e.g., high, com_dis='1'), the respective transmitter circuit 102 is set to a high-impedance state and the respective receiver circuit 104 is enabled. Therefore, when signal com_dis$_{LV}$ is de-asserted communication takes place from the low-voltage die 10a to the high-voltage die 10b (sec, e.g., interval COM1 in FIG. 2), and when signal com_dis$_{HV}$ is de-asserted communication takes place from the high-voltage die 10b to the low-voltage die 10a (sec, e.g., interval COM2 in FIG. 2). The control logic of the dies drives properly the signals com_dis in order to allow communication from a die to the other and vice-versa.

FIG. 4 is a circuit block diagram exemplary of a possible implementation of a receiver circuit 104 (e.g., 104a or 104b), and FIG. 5 is a time diagram including waveforms exemplary of signals in the receiver circuit 104 of FIG. 4, which illustrate possible operation of the receiver circuit. The input terminals of circuit 104, which may be referenced to a local ground GND (e.g., a low-voltage ground GND$_{LV}$ in the case of circuit 104a, and a high-voltage ground GND$_{HV}$ in the case of circuit 104b) via respective resistors, receive the differential signal Vd (e.g., Vd$_{LV}$ or Vd$_{HV}$) and are coupled to an amplifier stage 40 that produces an amplified replica of the differential signal. The amplified differential signal is received at a pair of comparators 42, 44 having opposite input polarities (e.g., the positive output of amplifier 40 being coupled to the negative input of comparator 42 and to the positive input of comparator 44, and the negative output of amplifier 40 being coupled to the positive input of comparator 42 and to the negative input of comparator 44). Therefore, comparator 42 produces a (digital) signal set$_n$ that includes pulses corresponding to the positive pulses of signal Vd (e.g., signal set$_n$ is normally high and includes low pulses) and comparator 44 produces a (digital) signal reset$_n$ that includes pulses corresponding to the negative pulses of signal Vd (e.g., signal reset$_n$ is normally high and includes low pulses). Signals set$_n$ and reset$_n$ are used as the set and reset signals of a set-reset (S—R) flip-flop 46. In particular, flip-flop 46 receives a bias voltage V$_{DD}$ at its data input terminal D, signal set$_n$ (possibly complemented by an inverter stage) at its clock input terminal C$_P$, and signal reset$_n$, at its reset input terminal C$_D$. The data output terminal Q of flip-flop 46 thus produces the reception signal rx_com that corresponds to a (delayed) replica of the transmission signal tx_com sent by the other die of the device 10 (as exemplified in FIG. 5).

In various applications, a gate driver device as exemplified in FIG. 1 may be placed (e.g., operated) in a noisy environment. Therefore, for some unpredictable and/or unforeseen reason (e.g., disturbances, interferences, spurious spikes, etc.), one or more pulses (e.g., spikes) of the differential signal Vd may occasionally not be decoded (e.g., detected) by the receiver circuit 104 (e.g., 104a or 104b), as exemplified in the waveforms of FIG. 6, where a negative pulse MP of signal Vd is not detected (e.g., it is missed) by the receiver circuit 104. In such cases, the reconstructed signal rx_com may not switch to the expected value and may retain its last value (as exemplified in FIG. 6 by signal rx_com that remains stationary at a high logic value after pulse MP, when it should switch to a low logic value instead, as exemplified by the dotted waveform labeled MV). The reconstructed signal rx_com switches again at the next "useful" pulse of signal Vd correctly detected (e.g., the next negative pulse NP, as exemplified in FIG. 6, if the missed pulse was a negative one). In other cases, to the contrary, unexpected spikes (e.g., due to disturbances) in the differential signal Vd may generate spurious, unwanted commutations of the reconstructed signal rx_com.

In order to mitigate the above-discussed issue (i.e., the issue of missing "good" pulses and/or detecting "spurious" pulses in the signal Vd at the input of a receiver circuit 104), a conventional approach may rely on using on-off keying (OOK) modulation of the input signal (tx_com$_{LV}$ or tx_com$_{HV}$) as exemplified in FIGS. 7, 8 and 9. In this case, each semiconductor die (e.g., 10a and 10b) includes a mixer circuit 70 that receives the input signal tx_com (tx_com$_{LV}$ or tx_com$_{HV}$, respectively) and a high-frequency carrier signal C(t) (e.g., a sinusoidal signal having a frequency in the range of 100 MHz to 500 MHz) and produces an OOK-modulated signal tx_com_OOK (tx_com_OOK$_{LV}$ or tx_com_OOK$_{HV}$, respectively) for transmission to the transmitter circuit 102 (e.g., 102a or 102b, respectively), according to the known equations of OOK modulation, reproduced in the following:

$$\text{tx\_com\_OOK} = \begin{cases} C(t), & \text{if tx\_com} = 1 \\ 0, & \text{if tx\_com} = 0 \end{cases}$$

or, equivalently:

$$\text{tx\_com\_OOK} = \text{tx\_com} \cdot C(t)$$

Additionally, each die (10a and 10b) of the gate driver device 10 may include an oscillator circuit for generating the high frequency carrier signal C(t).

According to this approach, the receiver circuit 104 may be configured to count a number N of pulses (e.g., N=2 as exemplified in FIGS. 8 and 9) to reconstruct the signal rx_com. After receiving a number N of pulses, the receiver circuit 104 asserts (e.g., sets to a high logic value) the reconstructed signal rx_com. Otherwise, the reconstructed signal rx_com remains de-asserted (e.g., set to a low logic value). If the receiver circuit 104 misses a pulse, it may still be able to reconstruct the signal rx_com, insofar as it will start counting the pulses from the pulse that immediately follows the missed one: see, for instance, the missed pulse MP' in FIG. 9, with the output signal rx_com being asserted (e.g., set to a high logic value) at the third pulse of signal tx_com_OOK, because the receiver circuit 104 started counting on the second pulse instead of the first one. The higher is the frequency of the carrier signal C(t), the faster is the receiver circuit in correcting the value of the reconstructed signal rx_com.

However, an approach based on OOK modulation introduces a delay in the communication between the low-voltage die 10a and the high-voltage die 10b, insofar as the receiver circuit 104 needs a time interval T$_{decoding}$ before assigning the right value to the reconstructed signal rx_com at each commutation thereof, as exemplified in FIGS. 8 and 9. The time interval T$_{decoding}$ is substantially equal to N times the period of the carrier signal C(t), N being again the number of pulses detected (e.g., counted) before assigning a new value to (e.g., asserting or de-asserting) the signal rx_com.

Therefore, there is a need in the art to provide an isolated communication channel (e.g., for implementation in a gate driver device, possibly bidirectional) having an improved architecture that solves the issues discussed above.

BRIEF SUMMARY

One or more embodiments contributes in providing such an improved isolated communication channel, e.g., in an isolated gate driver device.

According to one or more embodiments, such an improved isolation communication channel can be achieved by an electronic device (e.g., an isolated driver device) having the features set forth in the claims that follow.

One or more embodiments may relate to a corresponding electronic system.

One or more embodiments may relate to a corresponding method of transmitting a data signal across a galvanic isolation barrier.

The claims are an integral part of the technical teaching provided herein in respect of the embodiments.

According to a first aspect of the present description, an electronic device includes a first semiconductor die and a second semiconductor die. A pulse generator circuit is implemented on the first semiconductor die, and is configured to receive a digital input signal having a first frequency and a clock signal having a second frequency. The second frequency is higher than the first frequency. The pulse generator circuit is further configured to produce a digital transmission signal that includes a pulse following each edge of the input digital signal and of the clock signal. The pulse has a first polarity (e.g., low pulse with respect to a high baseline) when the digital input signal has a first (e.g., low) logic value and a second polarity (e.g., high pulse with respect to a low baseline) when the digital input signal has a second (e.g., high) logic value. A transmitter circuit is implemented on the first semiconductor die, and is configured to receive the digital transmission signal and to produce a pair of complementary digital signals. A first one of the complementary digital signals is a replica of the digital transmission signal and is produced at a first output node of the transmitter circuit, and a second one of the complementary digital signals is the complement of the digital transmission signal and is produced at a second output node of the transmitter circuit. A galvanic isolation barrier is implemented on the first semiconductor die or on the second semiconductor die, and includes a first capacitor having a first terminal coupled to the first output node of the transmitter circuit and a second capacitor having a first terminal coupled to the second output node of the transmitter circuit. A differential signal is produced between a second terminal of the first capacitor and a second terminal of the second capacitor. The differential signal includes a spike of a first polarity (e.g., positive) at each rising edge of the digital transmission signal and a spike of a second polarity (e.g., negative) at each falling edge of the digital transmission signal. A first comparator circuit is implemented on the second semiconductor die, and is configured to receive the differential signal and to produce an intermediate set signal that includes a pulse at each spike of the differential signal having the first polarity. A second comparator circuit is implemented on the second semiconductor die, and is configured to receive the differential signal and to produce an intermediate reset signal that includes a pulse at each spike of the differential signal having the second polarity. A logic circuit is implemented on the second semiconductor die, and is configured to receive the intermediate set signal and the intermediate reset signal. The logic circuit is further configured to produce a final set signal by activating masking of (the pulses of) the intermediate set signal in response to a pulse of the intermediate reset signal, and de-activating masking of (the pulses of) the intermediate set signal in response to the end of a pulse of the intermediate set signal or in response to a time interval elapsing after (the end of) a pulse of the intermediate reset signal. The logic circuit is further configured to produce a final reset signal by activating masking of (the pulses of) the intermediate reset signal in response to a pulse of the intermediate set signal, and de-activating masking of (the pulses of) the intermediate reset signal in response to the end of a pulse of the intermediate reset signal or in response to a time interval elapsing after (the end of) a pulse of the intermediate set signal. An output control circuit is implemented on the second semiconductor die, and is configured to receive the final set signal and the final reset signal, and is further configured to assert a digital output signal in response to a pulse being detected in the final set signal and de-assert the digital output signal in response to a pulse being detected in the final reset signal.

One or more embodiments may thus provide a communication channel that allows transmitting a data signal across a galvanic isolation barrier relying on a simple architecture (e.g., including only additional logic circuits).

According to another aspect of the present description, an electronic system includes a processing unit and an electronic device according to one or more embodiments. The processing unit is configured to generate the digital input signal and the clock signal received by the electronic device.

According to another aspect of the present description, a method of transmitting a data signal across a galvanic isolation barrier includes:
  receiving a digital input signal having a first frequency and a clock signal having a second frequency, wherein the second frequency is higher than the first frequency;
  producing a digital transmission signal that includes a pulse following each edge of the input digital signal and of the clock signal, the pulse having a first polarity (e.g., low pulse with respect to a high baseline) when the digital input signal has a first (e.g., low) logic value and a second polarity (e.g., high pulse with respect to a low baseline) when the digital input signal has a second (e.g., high) logic value;
  producing a pair of complementary digital signals, wherein a first one of the complementary digital signals is a replica of the digital transmission signal, and a second one of the complementary digital signals is the complement of the digital transmission signal;
  propagating the first complementary digital signal through a first capacitor and the second complementary digital signal through a second capacitor, whereby it is produced a differential signal that includes a spike of a first polarity (e.g., positive) at each rising edge of the digital transmission signal and a spike of a second polarity (e.g., negative) at each falling edge of the digital transmission signal;
  producing an intermediate set signal that includes a pulse at each spike of the differential signal having the first polarity;
  producing an intermediate reset signal that includes a pulse at each spike of the differential signal having the second polarity;
  producing a final set signal by activating masking of (the pulses of) the intermediate set signal in response to a pulse of the intermediate reset signal, and de-activating masking of (the pulses of) the intermediate set signal in response to the end of a pulse of the intermediate set signal or in response to a time interval elapsing after (the end of) a pulse of the intermediate reset signal;
  producing a final reset signal by activating masking of (the pulses of) the intermediate reset signal in response to a pulse of the intermediate set signal, and de-activating masking of (the pulses of) the intermediate reset signal in response to the end of a pulse of the intermediate reset signal or in response to a time interval elapsing after (the end of) a pulse of the intermediate set signal;
  asserting a digital output signal in response to a pulse being detected in the final set signal and de-asserting the digital output signal in response to a pulse being detected in the final reset signal.

BRIEF DESCRIPTION OF THE SEVERAL VIEWS OF THE DRAWINGS

One or more embodiments will now be described, by way of example only, with reference to the annexed figures, wherein.

DETAILED DESCRIPTION

In the ensuing description, one or more specific details are illustrated and provide an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is included in at least one embodiment. Hence, phrases such as "in an embodiment" or "in one embodiment" that may be present in one or more points of the present description do not necessarily refer to one and the same embodiment. Moreover, particular configurations, structures, or characteristics may be combined in any adequate way in one or more embodiments.

The headings/references used herein are provided merely for convenience and hence do not define the extent of protection or the scope of the embodiments.

Throughout the figures annexed herein, unless the context indicates otherwise, like parts or elements are indicated with like references/numerals and a corresponding description will not be repeated for the sake of brevity.

One or more embodiments may provide an improved isolated communication channel (e.g., for use in an isolated driver device 10), based on the recognition that a receiver circuit 104 (e.g., in the high voltage die 10b of the driver device 10) is configured to generate a reconstructed PWM signal rx_com by setting the signal rx_com to a high logic value ('1') in response to a positive pulse (e.g., spike) being detected in the input differential signal Vd (e.g., $Vd_{HV}$) and setting the signal rx_com to a low logic value ('0') in response to a negative pulse (e.g., spike) being detected in the input differential signal Vd (e.g., $Vd_{HV}$), as previously discussed with reference to FIGS. 1 to 5. Specifically, one or more embodiments implement a mechanism to continuously generate pulses (e.g., spikes) in the input differential signal Vd by exploiting a clock signal available at the transmitter side, so that even if a pulse is lost, the reconstructed signal can still switch correctly at the next pulse.

Figure 1:
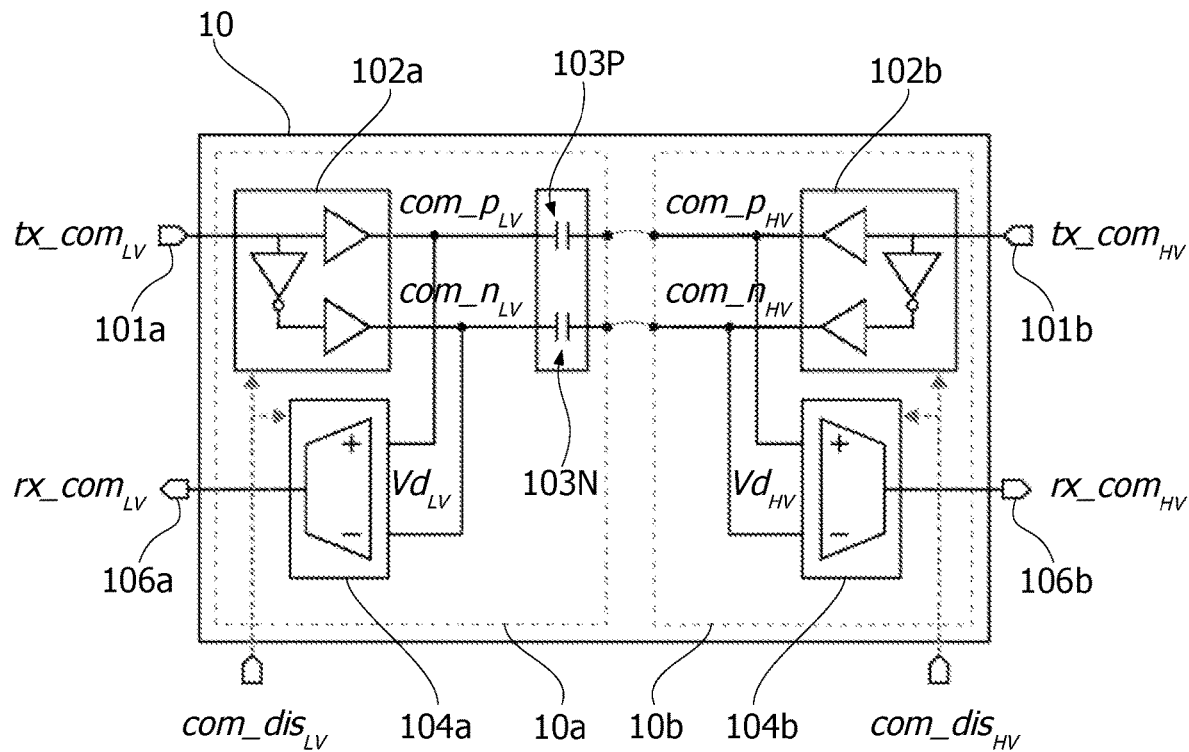
FIGS. 1 to 9 have already been described in the foregoing.
Figure 2:
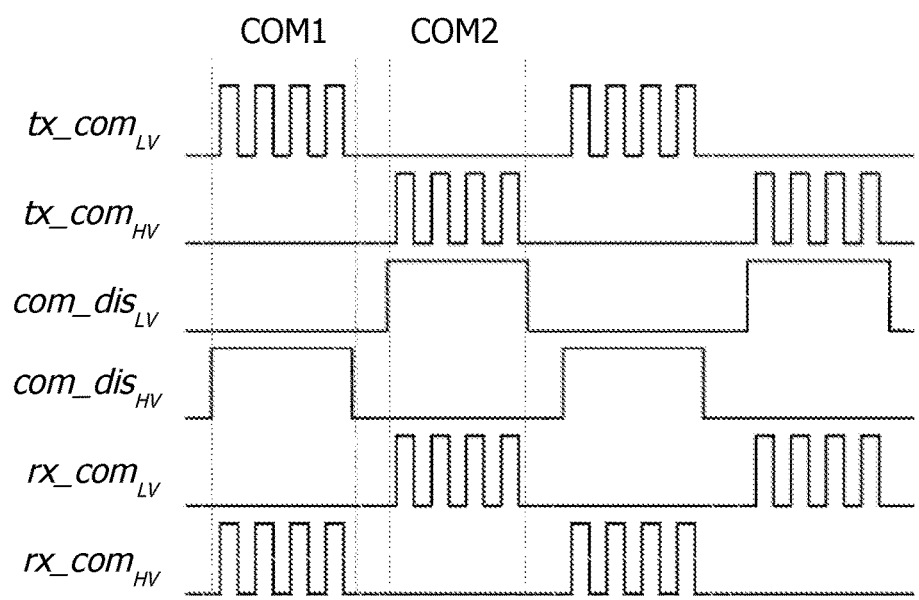
Figure 3:
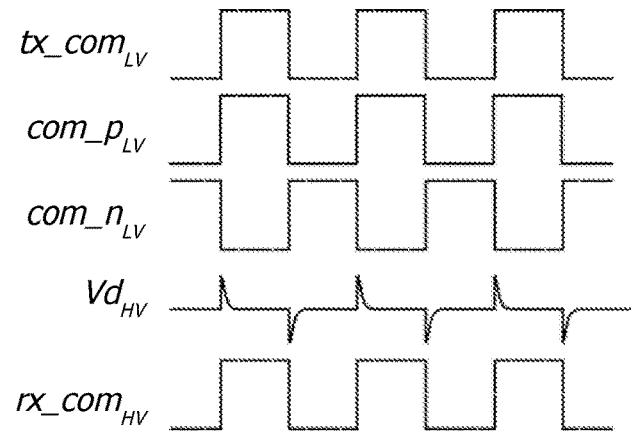
Figure 4:
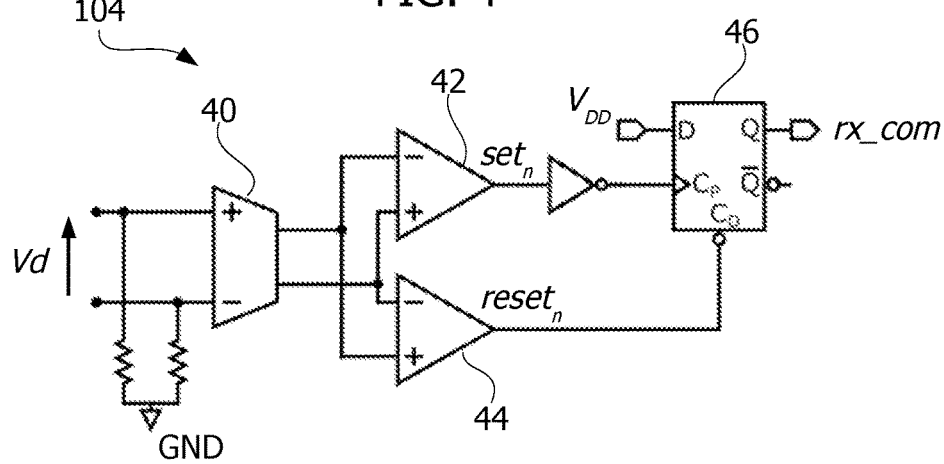
Figure 5:
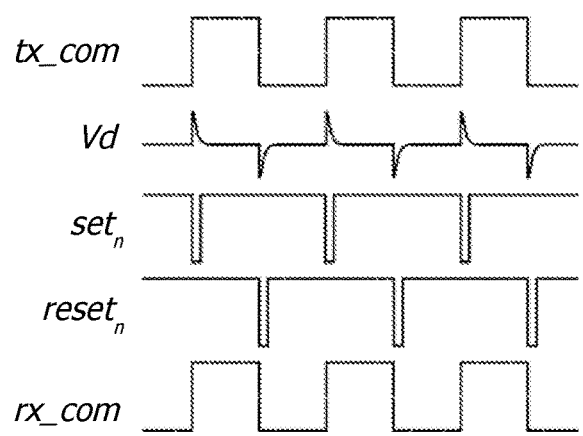
Figure 6:
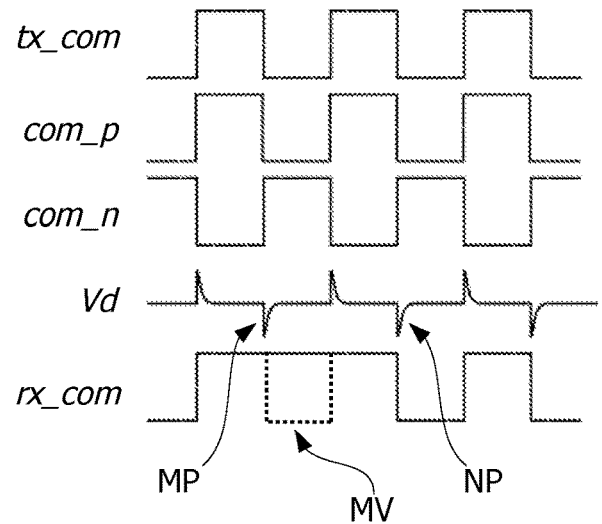
Figure 7:
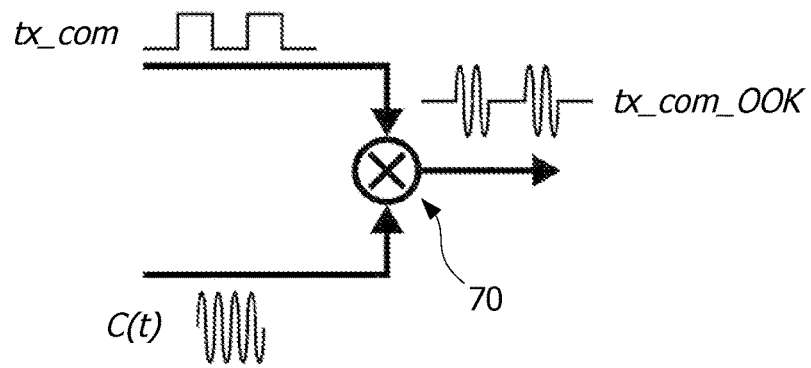
Figure 8:
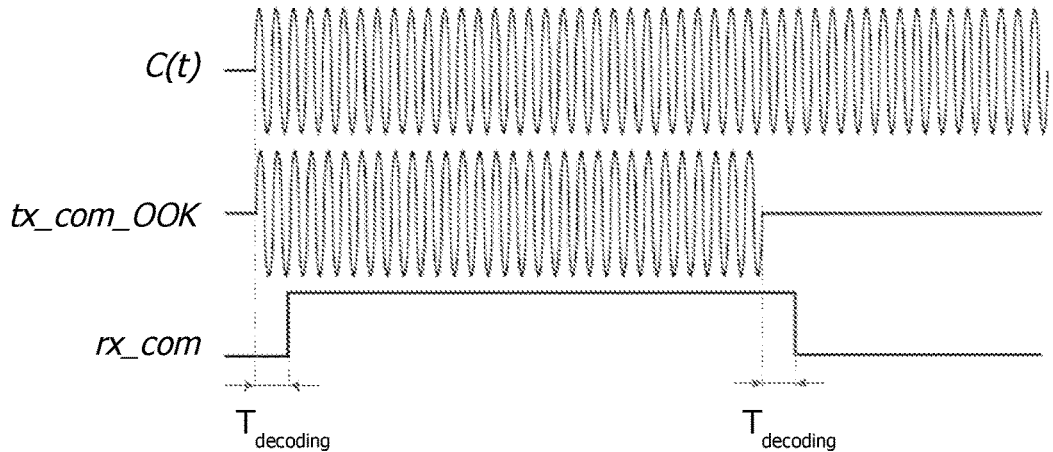
Figure 9:
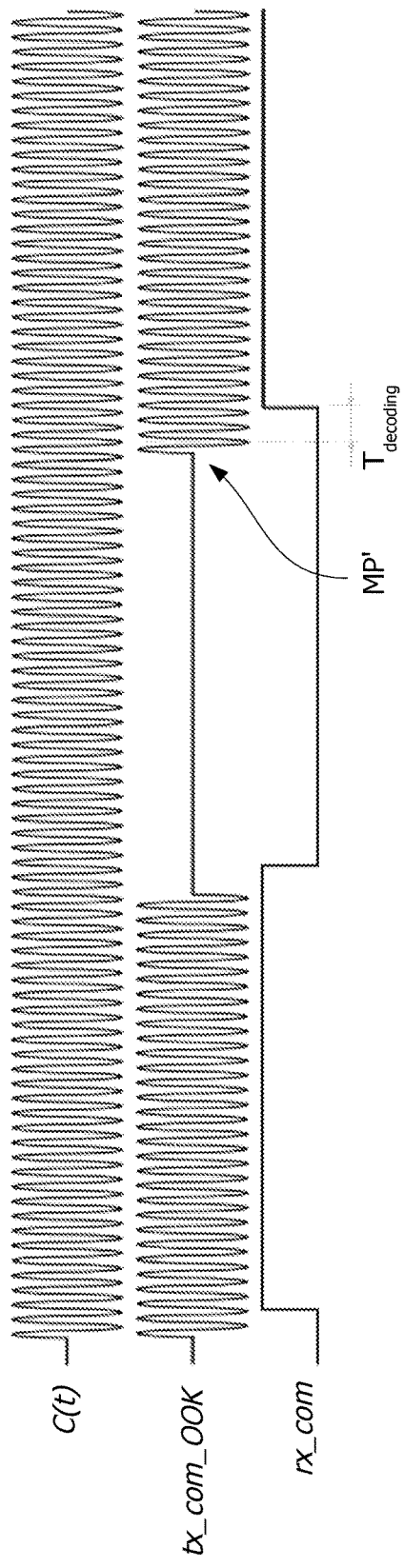
Figure 10:
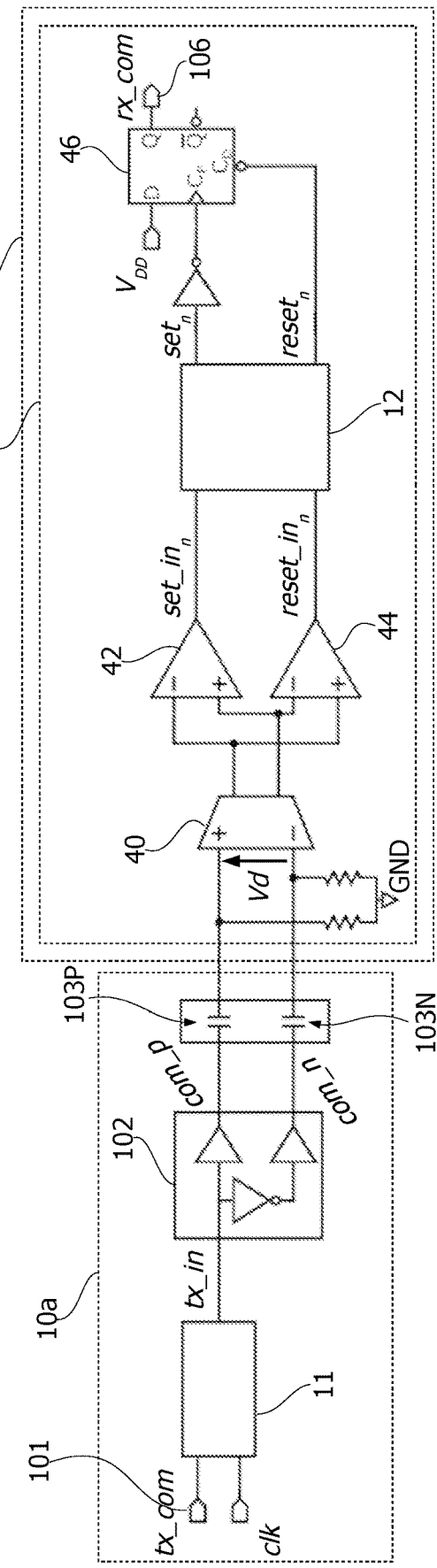
FIG. 10 is a circuit block diagram exemplary of an isolated communication channel according to one or more embodiments of the present description.

In particular, one or more embodiments may rely on the general architecture exemplified in FIG. 10, which is a circuit block diagram exemplary of an isolated communication channel according to one or more embodiments. It will be noted that throughout the present description, reference will mainly be made to the low-voltage to high-voltage part of the communication channel (e.g., the part of the communication channel that includes circuits 102a and 104b, having reference to FIG. 1) for the sake of brevity, but the same architecture and operating principles can be applied to the high-voltage to low-voltage part of the communication channel (e.g., the part of the communication channel that includes circuits 102b and 104a, having again reference to FIG. 1). For that reason, reference numerals such as 101, 102, 104, 106 (instead of 101a and 101b, 102a and 102b, 104a and 104b, 106a and 106b) will be used to indicate, respectively, the input pin, the transmitter circuit, the receiver circuit and the output pin of the communication channel; similarly, the subscripts LV and HV will be dropped from the references indicating the signals involved.

As exemplified in FIG. 10, the transmitter side of the improved communication channel includes a pulse generator circuit 11 arranged between the input pin 101 and the transmitter circuit 102. The pulse generator 11 receives the input signal tx_com (e.g., a PWM signal) and a clock signal clk available at the transmitter side (e.g., in the low-voltage die 10a), and produces a modified transmission signal tx_com in that is propagated to the transmitter circuit 102. The clock signal clk has a higher frequency than the input signal tx_com. Additionally, the receiver side of the improved communication channel includes a logic circuit 12 arranged between the comparators 42, 44 and the S—R flip-flop 46 in order to allow correct reconstruction (rx_com) of the transmitted signal tx_com at the output 106 of the flip-flop 46.

In particular, the transmitter side is configured to generate, via the pulse generator 11, a modified transmission signal tx_in that includes pulses not only at the edges of the transmission signal tx_com, but also at the edges of the clock signal clk. In this way, the differential signal Vd also includes all such pulses, and correction of a missed pulse can be done in a maximum time of half clock period. In order to be able to reconstruct the correct signal rx_com (i.e., equal to tx_com) at the receiver side, the pulses in the differential signal Vd should have a sign that is related to the level of the input signal tx_com (i.e., the differential signal Vd should bear memory of the value of the input signal tx_com). In particular, if tx_com='1' then signal Vd should include positive pulses, so that comparator 42 is triggered and (low) pulses are generated in the set signal $set_n$, while if tx_com='0' then signal Vd should include negative pulses, so that comparator 44 is triggered and (low) pulses are generated in the reset signal reset$_n$.

Figure 11:
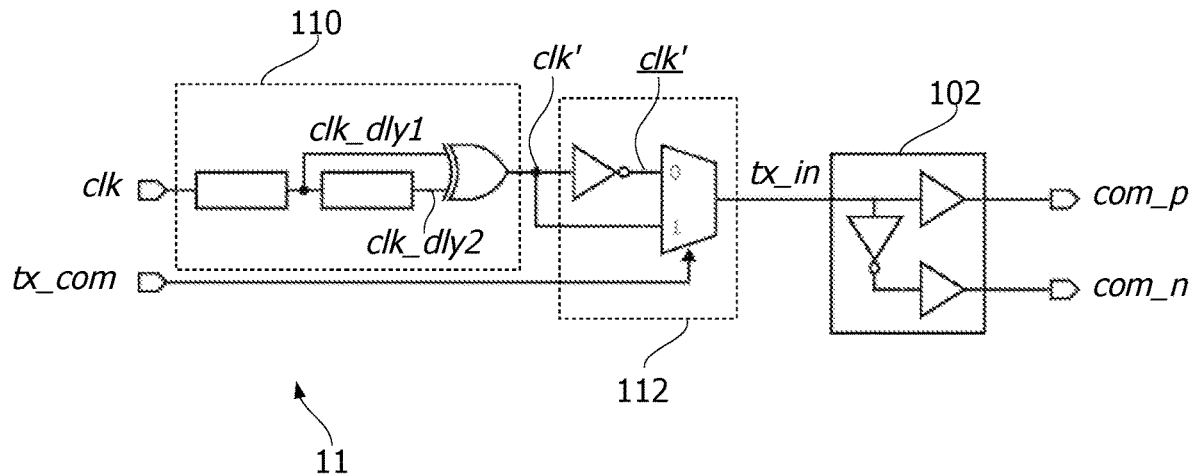
FIG. 11 is a circuit block diagram exemplary of a gate-level implementation of a pulse generator circuit for use in the transmitter side of a communication channel according to one or more embodiments of the present description.
Figure 12:
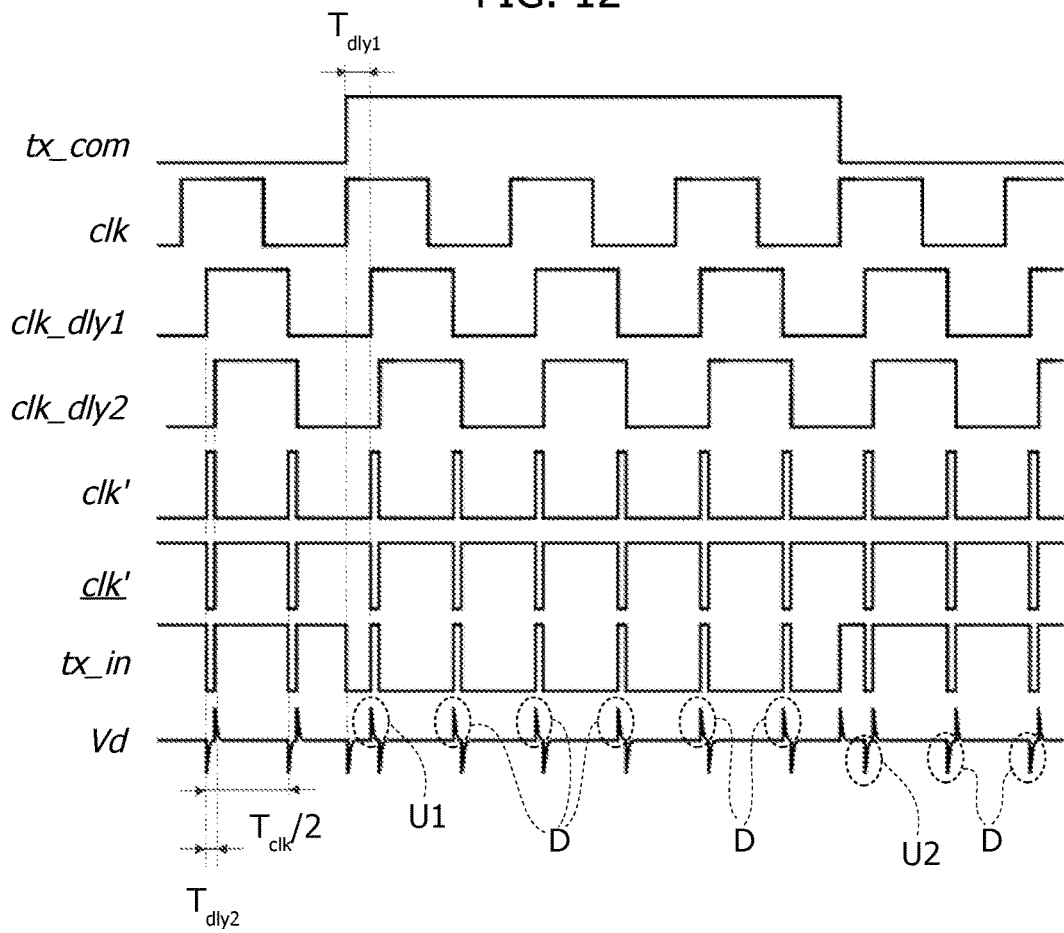
FIG. 12 is a time diagram including waveforms exemplary of signals in the transmitter side of a communication channel according to one or more embodiments of the present description.

FIG. 11 is a circuit block diagram exemplary of a possible gate-level implementation of a pulse generator circuit 11, and FIG. 12 is a time diagram including waveforms exemplary of signals in the transmitter side of the communication channel of FIG. 10, which illustrate possible operation of the transmitter side. Here, it is noted that there are no constraints on the propagation delay of signal tx_com, and that the clock signal clk is synchronous with the signal tx_com. The pulse generator 11 includes an internal pulse generator circuit 110 and a sign selector circuit 112. The internal pulse generator 110 receives the clock signal clk and produces a pulsed signal clk' that includes a (positive) pulse of duration $T_{dly2}$ following each edge of the clock signal clk, the pulses being delayed by a time interval $T_{dly1}$ with respect to the edges of the clock signal clk (and thus also with respect to the edges of the transmission signal tx_com). The sign selector circuit 112 produces the modified transmission signal tx_in by propagating either signal clk' or the complement clk' of signal clk' (i.e., its inverted replica) depending on the current value of the transmission signal tx_com, specifically propagating signal clk' if tx_com='1' and signal clk' if tx_com='0'.

In particular, in one or more embodiments, the internal pulse generator 110 includes a first delay circuit block (e.g., buffer) that receives the clock signal clk and propagates it with a delay $T_{dly1}$ thereby producing signal clk_dly1, a second delay circuit block (e.g., buffer) that receives signal clk_dly1 and propagates it with a delay $T_{dly2}$ thereby producing signal clk_dly2, and an exclusive-OR (XOR) gate that combines the output signals clk_dly1 and clk_dly2 from the first and second delay circuit blocks to produce the pulsed signal clk'.

In particular, in one or more embodiments, the sign selector circuit 112 includes an inverter gate that receives the pulsed signal clk' and produces the complement signal clk', and a multiplexer controlled by the transmission signal tx_com to pass signal clk' if tx_com is asserted ('1') or signal clk' if tx_com is de-asserted ('0').

Therefore, in one or more embodiments as exemplified in FIGS. 10 and 11, the transmitter circuit 102 receives signal tx_in at its input. As exemplified in FIG. 12, signal tx_in is a pulsed wave having period equal to $T_{elk}/2$ ($T_{elk}$ being the period of the clock signal elk), where the duration of each pulse is equal to $T_{dly2}$ and each pulse is delayed by a time $T_{dly1}$ with respect to an edge of the clock signal clk. The pulses of signal tx_in are positive (i.e., the pulse has a high logic value compared to a baseline low logic value) if signal tx_com com is asserted ('1') and negative (i.e., the pulse has a low logic value compared to a baseline high logic value) if signal tx_com is de-asserted ('0'). The resulting differential signal Vd produced downstream of the isolation capacitors 103P, 103N (and seen by the receiver circuit 104 of the communication channel) is also exemplified in FIG. 12: it includes a train of pulses (e.g., spikes), each spike corresponding to an edge of signal tx_in, in particular a positive spike at each rising edge of signal tx_in, and a negative spike at each falling edge of signal tx_in. In other words:

- a pair of spikes is generated in signal Vd following each edge of the clock signal clk (with a delay $T_{dly1}$), in particular a short positive spike rapidly followed by a short negative spike if signal tx_com is asserted, and a short negative spike rapidly followed by a short positive spike if signal tx_com is de-asserted; and
- a single spike is generated in signal Vd at each edge of the transmission signal tx_comm, in particular a short negative spike in the case of a rising edge of signal tx_com and a short positive spike in the case of a falling edge of signal tx_com.

In FIG. 12 are also indicated the first useful (positive) spike U1 that can be used by the receiver side to detect a commutation of signal tx_com from the low level to the high level, and the first useful (negative) spike U2 that can be used by the receiver side to detect a commutation of signal tx_com from the high level to the low level.

The circuit arrangement of the transmitter portion of the communication channel disclosed with reference to FIG. 11 is advantageous insofar as it continuously generates spikes in the differential signal Vd (even while the transmission signal tx_com is stationary) by just using logic gates (e.g., delay blocks, XOR gate, inverter, multiplexer) in addition to a conventional architecture. However, as exemplified in FIG. 12, it generates a pair of spikes (with opposite polarity) following each edge of the clock signal clk. Therefore, the receiver portion of the communication channel has to be modified in order to read (e.g., detect) only the first spike of each pair (see spikes labelled with D in FIG. 12), and ignore the second one. By doing so, when signal tx_com is asserted ('1'), only the positive spikes of the differential signal Vd are detected by the receiver circuit 104, and corresponding pulses are generated in the set signal set$_n$ (see again FIG. 5); similarly, when signal tx_com com is de-asserted ('0'), only the negative spikes of the differential signal Vd are detected by the receiver circuit 104, and corresponding pulses are generated in the reset signal reset$_n$ (see again FIG. 5).

Figure 13:
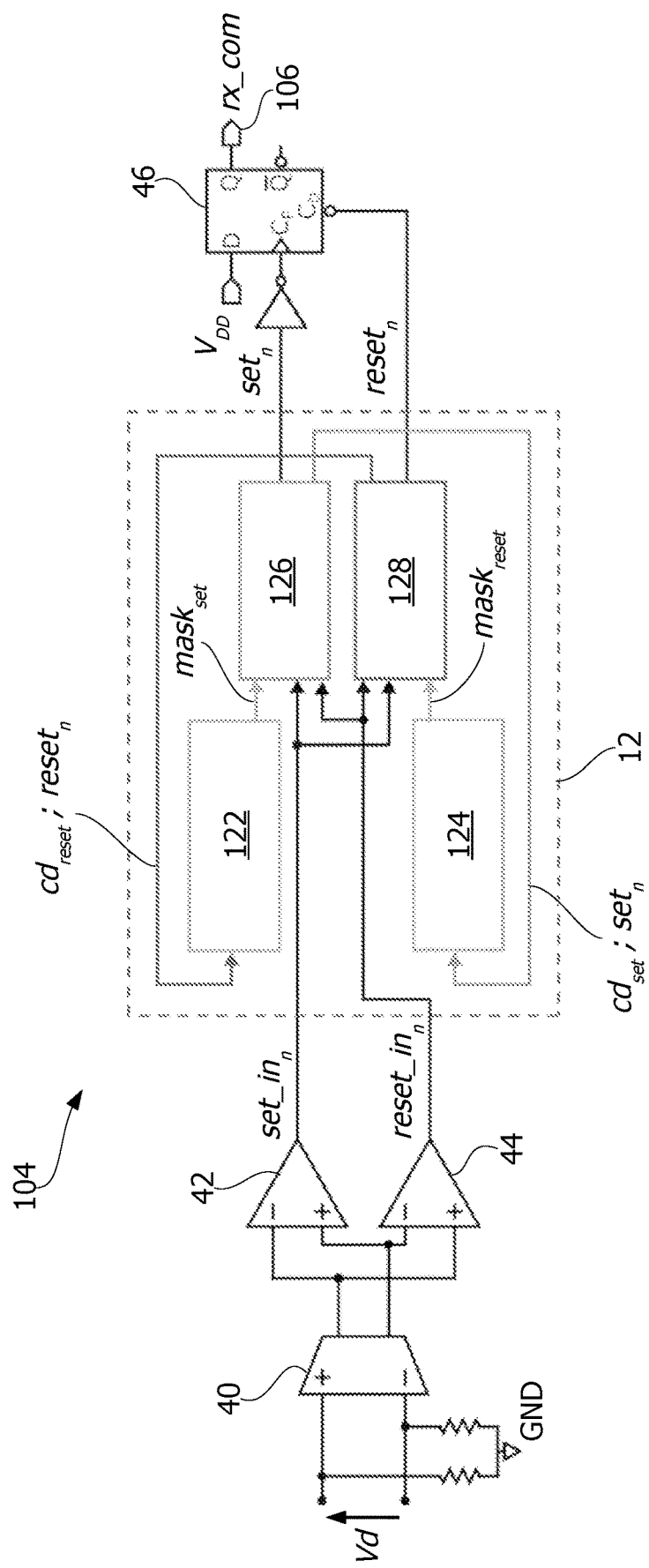
FIG. 13 is a circuit block diagram exemplary of an internal architecture of a logic circuit for use in the receiver side of a communication channel according to one or more embodiments of the present description.

To this regard, as anticipated, the receiver side of the improved communication channel includes a logic circuit 12 arranged between the comparators 42, 44 and the S—R flip-flop 46 in order to allow correct reconstruction of the transmitted signal tx_com com as the output rx_com of the flip-flop 46 (at pin 106). FIG. 13 is a circuit block diagram exemplary of a possible internal architecture of the logic circuit 12, FIG. 14 is a circuit block diagram exemplary of a possible gate-level implementation of the logic circuit 12, and FIG. 15 is a time diagram including waveforms exemplary of signals in the receiver side of the communication channel of FIG. 10, which illustrate possible operation of the receiver side.

As exemplified in FIG. 13, the logic circuit 12 includes:

- a first mask generator circuit 122 configured to mask the second (e.g., negative) spike of each pair of spikes of signal Vd received while signal tx_com is asserted ('1'), so as to correctly generate pulses in the set signal set$_n$;
- a second mask generator circuit 124 configured to mask the second (e.g., positive) spike of each pair of spikes of signal Vd received while signal tx_com com is de-asserted ('0'), so as to correctly generate pulses in the reset signal reset$_n$;
- a first control circuit 126 configured to produce signal set$_n$ as a function of signal set_in$_n$, and of the masking operation of circuit 122, as well as configured to enable and disable the second mask generator circuit 124 as a function of signals set_in$_n$ and reset_in$_n$; and
- a second control circuit 128 configured to produce signal reset$_n$ as a function of signal reset_in$_n$ and of the masking operation of circuit 124, as well as configured to enable and disable the first mask generator circuit 122 as a function of signals set_in$_n$ and reset_in$_n$.

Figure 14:
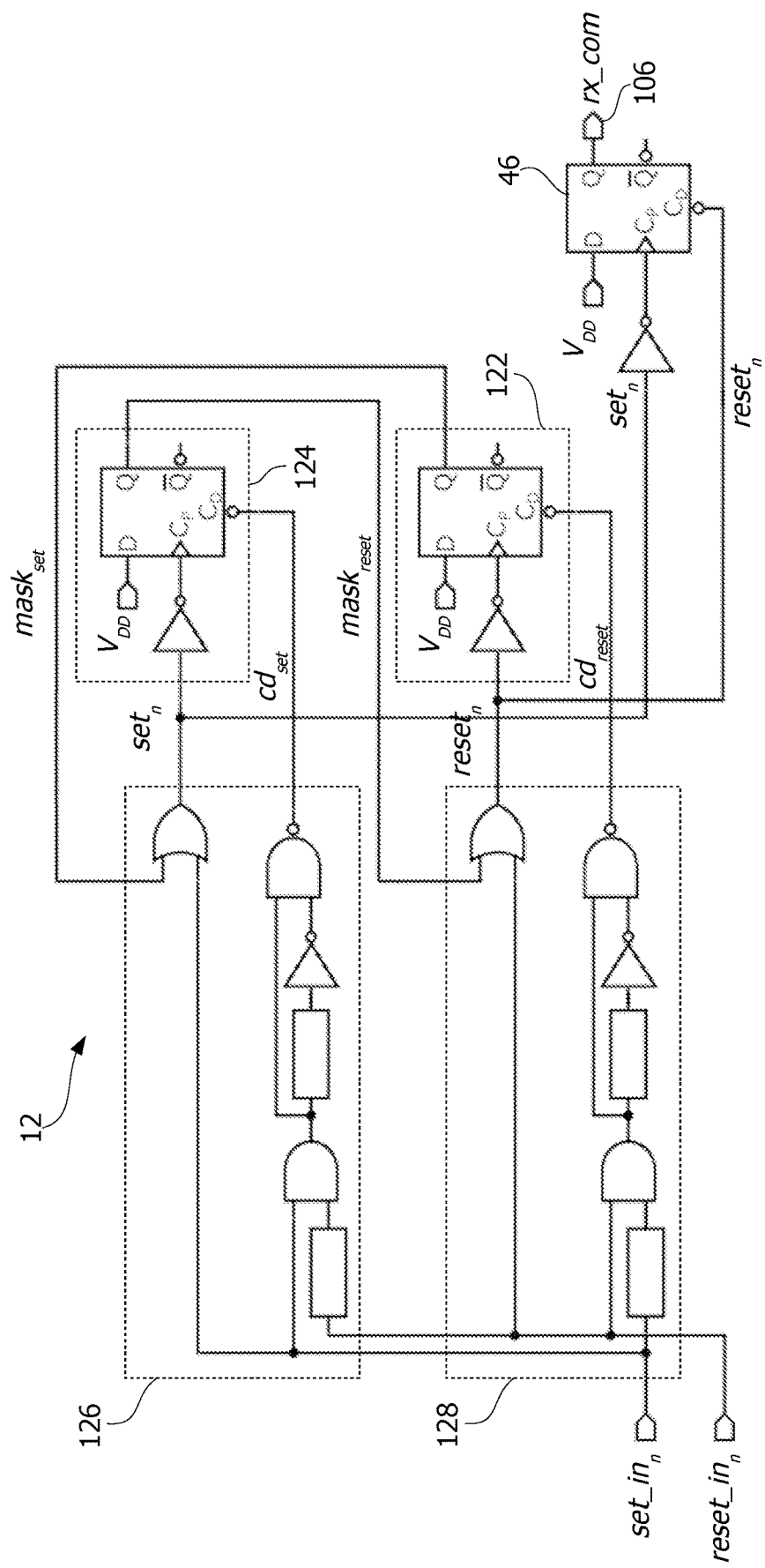
FIG. 14 is a circuit block diagram exemplary of a gate-level implementation of the logic circuit of FIG. 13.
Figure 15:
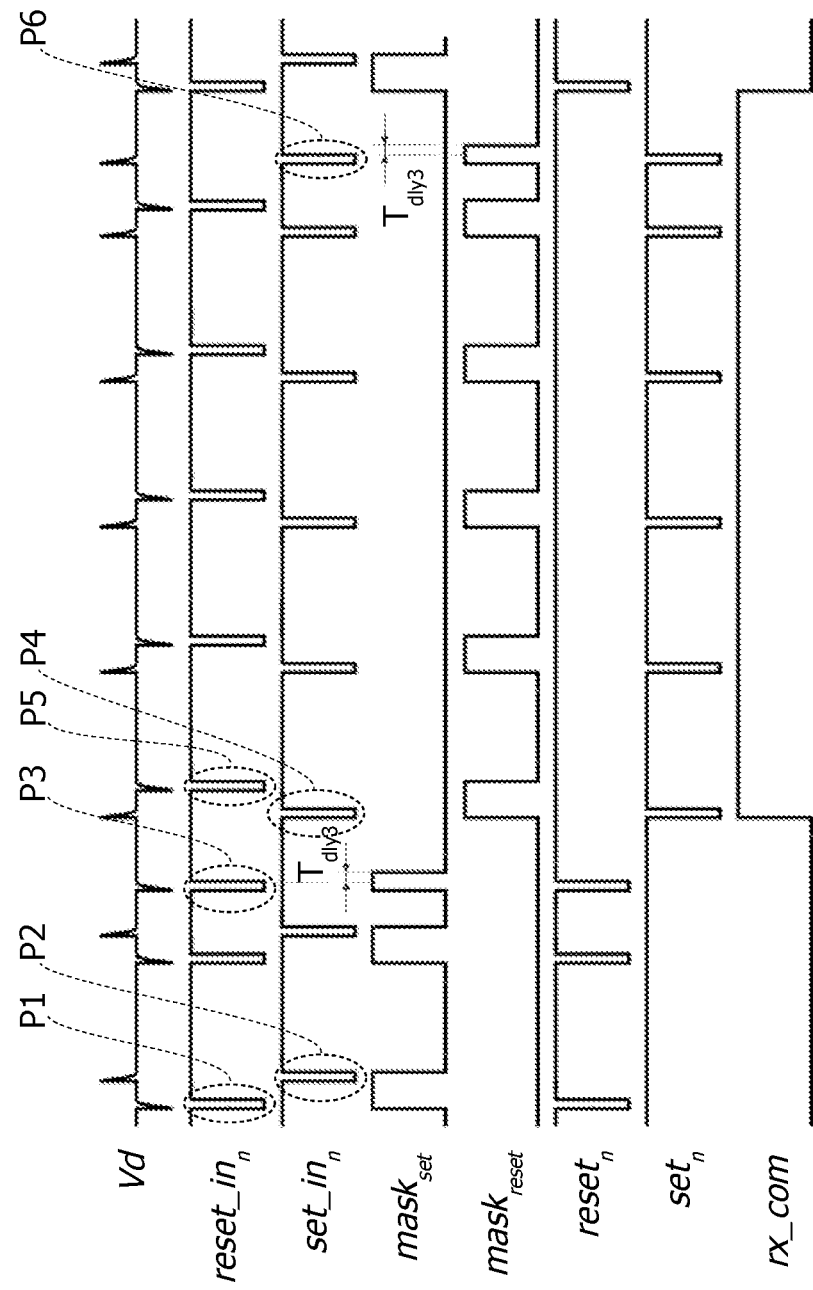
FIG. 15 is a time diagram including waveforms exemplary of signals in the receiver side of a communication channel according to one or more embodiments of the present description.

As exemplified in FIG. 14, the first and second control circuits 126 and 128 may have the same internal structure. In particular, each of these control circuits may include a first input terminal, a second input terminal, a third input terminal, a first delay circuit block coupled to the second input terminal, an AND gate configured to receive input signals from the first input terminal and from the first delay circuit block, a second delay circuit block coupled to the output of the AND gate, an inverter gate coupled to the output of the second delay circuit block, a NAND gate configured to receive input signals from the output of the AND gate and from the output of the inverter to produce a first output signal at a first output terminal of the control circuit, and an OR gate configured to receive input signals from the first input terminal and from the third input terminal to produce a second output signal at a second output terminal of the control circuit. Specifically, for the first control circuit 126: the first input terminal is configured to receive signal set_in$_n$, the second input terminal is configured to receive signal reset_in$_n$, the third input terminal is configured to receive the masking signal mask$_{set}$ from the first mask generator circuit 122, the first output terminal is configured to produce a masking control signal cd$_{set}$, and the second output terminal is configured to produce the pulsed signal set$_n$. Specifically, for the second control circuit 128: the first input terminal is configured to receive signal reset_in$_n$, the second input terminal is configured to receive signal set_in$_n$, the third input terminal is configured to receive the masking signal mask$_{reset}$ from the second mask generator circuit 124, the first output terminal is configured to produce a masking control signal cd$_{reset}$, and the second output terminal is configured to produce the pulsed signal reset$_n$.

As exemplified in FIG. 14, the first and second mask generator circuits 122 and 124 may have the same internal structure. In particular, each of these mask generator circuits may include a first input terminal, a second input terminal, an inverter gate coupled to the first input terminal, and a set-reset flip-flop having a data input terminal D configured to receive the bias voltage V$_{DD}$, a clock input terminal C$_P$ configured to receive the signal output by the inverter gate, a reset input terminal C$_D$ configured to receive the signal from the second input terminal of the mask generator circuit, and a data output terminal Q configured to produce an output signal at an output terminal of the mask generator circuit. Specifically, for the first mask generator circuit 122: the first input terminal is coupled to the second output terminal of the control circuit 128 to receive signal reset$_n$, the second input terminal is coupled to the first output terminal of the control circuit 128 to receive signal cd$_{reset}$, and the output terminal is configured to produce the masking signal mask$_{set}$ received at the third input terminal of the control circuit 126. Specifically, for the second mask generator circuit 124: the first input terminal is coupled to the second output terminal of the control circuit 126 to receive signal set$_n$, the second input terminal is coupled to the first output terminal of the control circuit 126 to receive signal cd$_{set}$, and the output terminal is configured to produce the masking signal mask$_{reset}$ received at the third input terminal of the control circuit 128.

As illustrated in FIG. 15, the input signals set_in$_n$ and reset_in$_n$ are normally high. When the first input signal (e.g., reset_in$_n$) has a high-to-low edge (see the falling edge of pulse P1, which corresponds to a first, negative spike of signal Vd), the mask for the second input signal (e.g., set_in$_n$) is activated (see signal mask$_{set}$ that goes to '1'). Therefore, the second input signal (e.g., set_in$_n$) is not propagated to the first output of circuit 12: the corresponding output signal (e.g., set$_n$) is forced to a high logic value ('1'), and this has the effect of masking the following pulse of the second input signal (see pulse P2, which corresponds to a second, positive spike of signal Vd that makes a pair with the preceding negative spike). Masking of the second input signal (e.g., set_in$_n$) is lifted (i.e., deactivated, the masking signal mask$_{set}$ goes again to '0') when:

i) the second input signal (e.g., set_in$_n$) has a low-to-high edge (see the rising edge of pulse P2), indicating that the pulse of the second input signal has been completely masked; and/or ii) after a time delay T$_{dly3}$ from a low-to-high edge of the first input signal (e.g., reset_in$_n$—see the rising edge of pulse 3), for the case of single spike of signal Vd (i.e., when the spike is produced by an edge of signal tx_com); the delay T$_{dly3}$ satisfies the condition T$_{dly2}$<T$_{dly3}$<T$_{dly1}$.

Similarly, when the second input signal (e.g., set_in$_n$) has a high-to-low edge (see the falling edge of pulse P4, which corresponds to a first, positive spike of signal Vd), the mask for the first input signal (e.g., reset_in$_n$) is activated (see signal mask$_{reset}$ that goes to '1'). Therefore, the first input signal (e.g., reset_in$_n$) is not propagated to the second output of circuit 12: the corresponding output signal (e.g., reset$_n$) is forced to a high logic value ('1'), and this has the effect of masking the following pulse of the first input signal (see pulse P5, which corresponds to a second, negative spike of signal Vd that makes a pair with the preceding positive spike). Masking of the first input signal (e.g., reset_in$_n$) is lifted (i.e., deactivated, the masking signal mask$_{reset}$ goes again to '0') when:

i) the first input signal (e.g., reset_in$_n$) has a low-to-high edge (see the rising edge of pulse P5), indicating that the pulse of the first input signal has been completely masked; and/or ii) after a time delay T$_{dly3}$ from a low-to-high edge of the second input signal (e.g., set_in$_n$—see the rising edge of pulse P6), for the case of single spike of signal Vd (i.e., when the spike is produced by an edge of signal tx_com); the delay T$_{dly3}$ satisfies the condition T$_{dly2}$<T$_{dly3}$<T$_{dly1}$.

Figure 16:
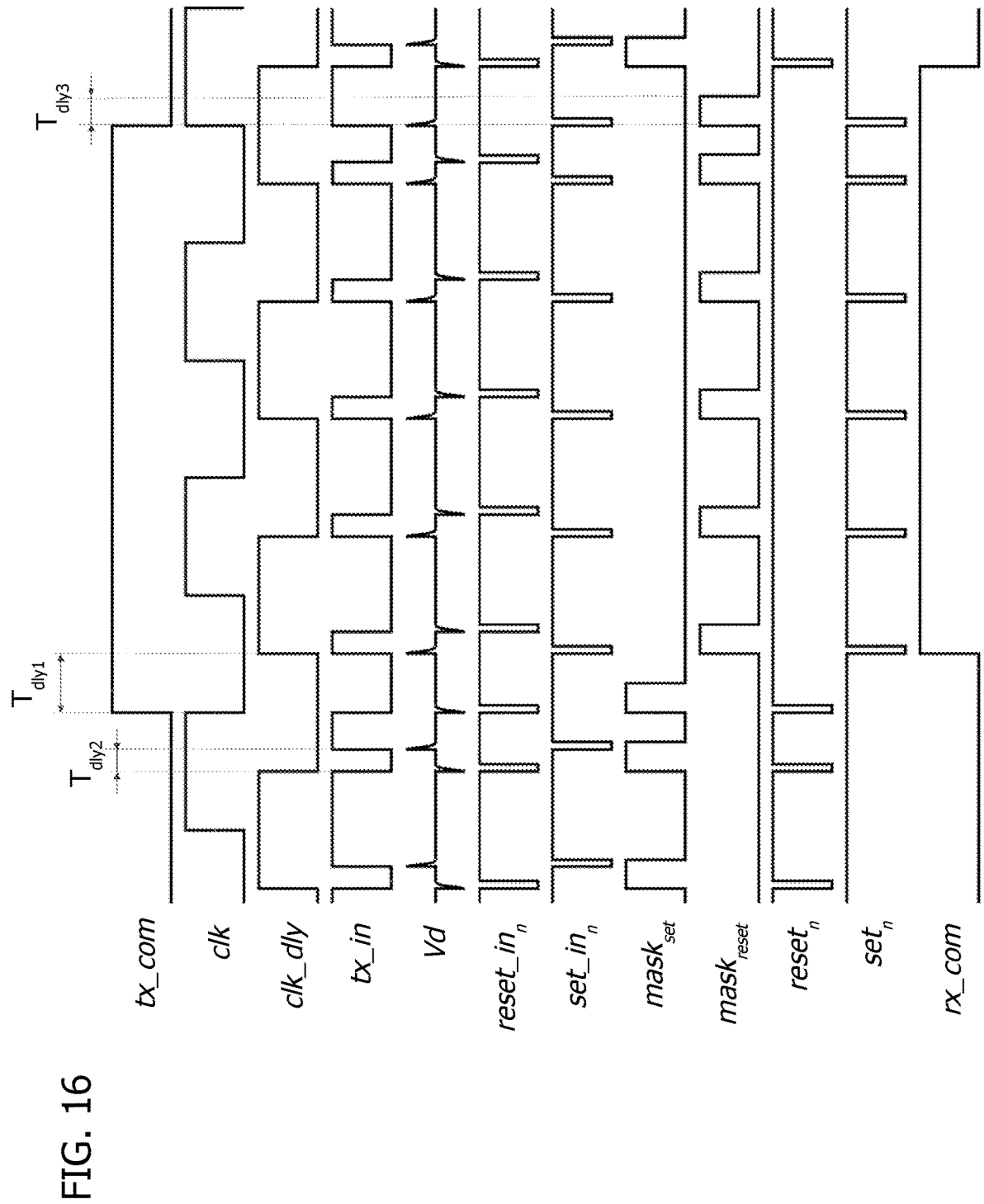
FIG. 16 is a time diagram including waveforms exemplary of signals in a communication channel according to one or more embodiments of the present description.

FIG. 16 is a time diagram including waveforms exemplary of signals in the communication channel according to one or more embodiments, which illustrate possible operation of the communication channel (from the input signal tx_com to the output signal rx_com with various intermediate signals) as disclosed in the foregoing.

Figure 17:
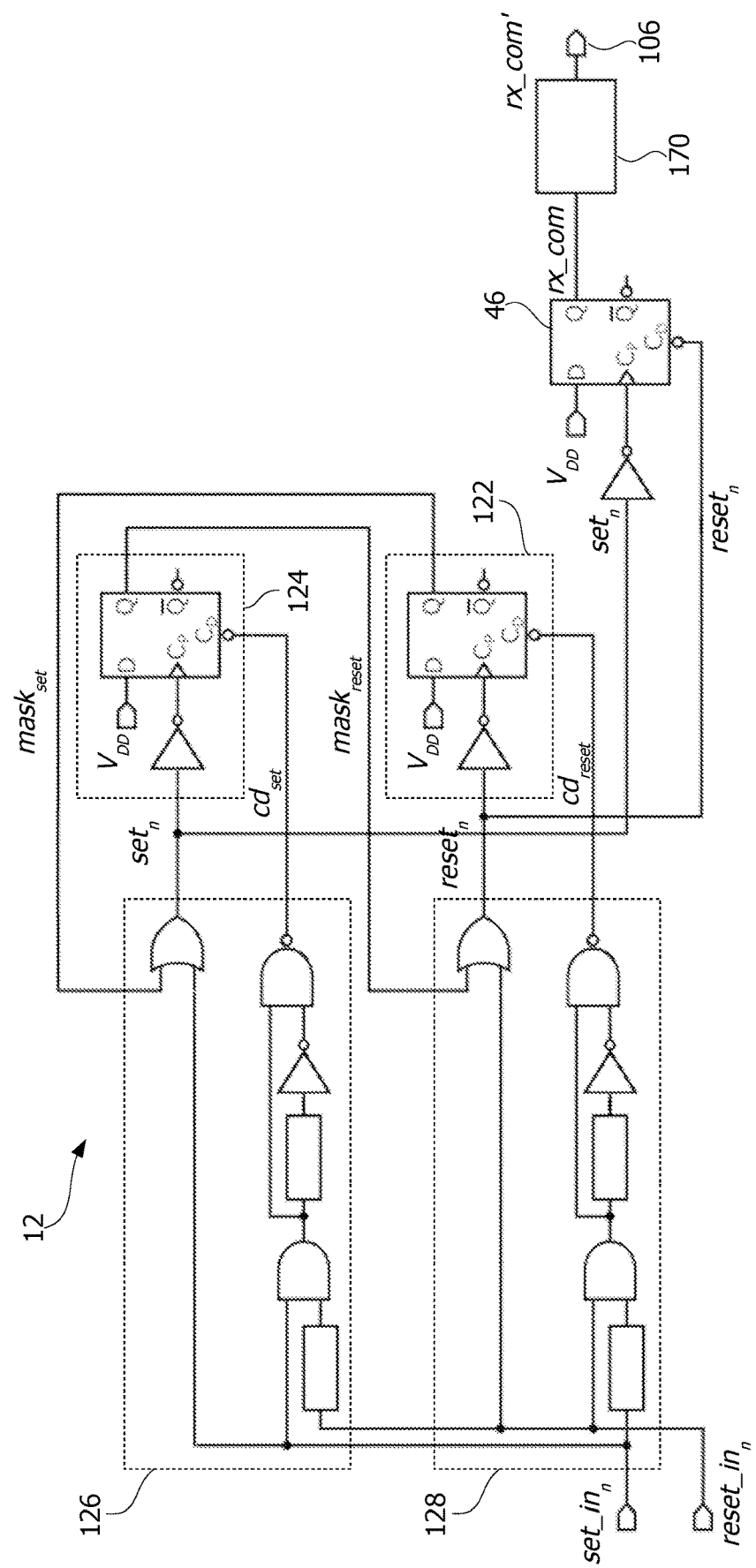
FIG. 17 is a circuit block diagram exemplary of a variant embodiment of the circuit of FIG. 14.

FIG. 17 is a circuit block diagram exemplary of a variant embodiment that improves the common mode transient immunity (CMTI, i.e., the maximum tolerable rate of rise or fall of the common mode voltage applied to two isolated circuits) of the communication channel (e.g., providing CMTI up to 100 V/ns). In particular, compared to the embodiments previously described, the embodiment of FIG. 17 includes a low-pass filter circuit 170 arranged between the data output terminal Q of the flip-flop 46 and the output pin 106 of the communication channel, to produce a filtered output signal rx_com'. In this case, in the presence of a common mode voltage transient, even if an error occurs in signal rx_com, the actual output rx_com' takes an additional time (fixed by the time constant of filter 170) before switching, so that the transient may have expired earlier and the spurious switching can be avoided.

One or more embodiments may thus prove advantageous insofar as they provide a robust isolated communication channel without the need of implementing a high-frequency oscillator for producing a carrier wave for modulation (e.g., OOK modulation); additionally, one or more embodiments rely on a simple implementation (e.g., just including additional logic gates compared to the conventional solutions), which is compatible with the conventional transmitter/receiver architectures.

Without prejudice to the underlying principles, the details and embodiments may vary, even significantly, with respect to what has been described by way of example only, without departing from the extent of protection.

The extent of protection is determined by the annexed claims.

An electronic device (10), may be summarized as including a first semiconductor die (10a) and a second semiconductor die (10b); a pulse generator circuit (11) implemented on said first semiconductor die (10a), the pulse generator circuit (11) being configured to receive a digital input signal (tx_com) having a first frequency and a clock signal (clk) having a second frequency, wherein said second frequency is higher than said first frequency, the pulse generator circuit (11) being further configured to produce a digital transmission signal (tx_in) that includes a pulse following each edge of said input digital signal (tx_com) and of said clock signal (clk), said pulse having a first polarity when said digital input signal (tx_com) has a first logic value and a second polarity when said digital input signal (tx_com) has a second logic value; a transmitter circuit (102) implemented on said first semiconductor die (10a), the transmitter circuit (102) being configured to receive said digital transmission signal (tx_in) and to produce a pair of complementary digital signals (com_p, com_n), wherein a first one (com_p) of said complementary digital signals is a replica of said digital transmission signal (t_in) and is produced at a first output node of said transmitter circuit (102), and a second one (com_n) of said complementary digital signals is the complement of said digital transmission signal (tx_in) and is produced at a second output node of said transmitter circuit (102); a galvanic isolation barrier implemented on said first semiconductor die (10a) or on said second semiconductor die (10b), the galvanic isolation barrier including a first capacitor (103P) having a first terminal coupled to the first output node of said transmitter circuit (102) and a second capacitor (103N) having a first terminal coupled to the second output node of said transmitter circuit (102), whereby a differential signal (Vd) is produced between a second terminal of said first capacitor (103P) and a second terminal of said second capacitor (103N), the differential signal (Vd) including a spike of a first polarity at each rising edge of said digital transmission signal (tx_in) and a spike of a second polarity at each falling edge of said digital transmission signal (tx_in); a first comparator circuit (42) implemented on said second semiconductor die (10b), the first comparator circuit (42) being configured to receive said differential signal (Vd) and to produce an intermediate set signal (set_in$_n$) that includes a pulse at each spike of said differential signal (Vd) having said first polarity; a second comparator circuit (44) implemented on said second semiconductor die (10b), the second comparator circuit (44) being configured to receive said differential signal (Vd) and to produce an intermediate reset signal (reset_in$_n$) that includes a pulse at each spike of said differential signal (Vd) having said second polarity; a logic circuit (12) implemented on said second semiconductor die (10b), the logic circuit (12) being configured to receive said intermediate set signal (set_in$_n$) and said intermediate reset signal (reset_in$_n$), and further configured to: produce a final set signal (set$_n$) by activating masking (mask$_{set}$) of said intermediate set signal (set_in$_n$) in response to a pulse of said intermediate reset signal (reset_in$_n$), and de-activating masking (mask$_{set}$) of said intermediate set signal (set_in$_n$) in response to the end of a pulse of said intermediate set signal (set_in$_n$) or in response to a time interval ($T_{dly3}$) elapsing after a pulse of said intermediate reset signal (reset_in$_n$); and produce a final reset signal (reset$_n$) by activating masking (mask$_{reset}$) of said intermediate reset signal (reset_in$_n$) in response to a pulse of said intermediate set signal (set_in$_n$), and de-activating masking (mask$_{reset}$) of said intermediate reset signal (reset_in$_n$) in response to the end of a pulse of said intermediate reset signal (reset_in$_n$) or in response to a time interval ($T_{dly3}$) elapsing after a pulse of said intermediate set signal (set_in$_n$); and an output control circuit (46) implemented on said second semiconductor die (10b), the output control circuit (46) being configured to receive said final set signal (set$_n$) and said final reset signal (reset$_n$), and further configured to assert a digital output signal (rx_com) in response to a pulse being detected in said final set signal (set$_n$) and de-assert said digital output signal (rx_com) in response to a pulse being detected in said final reset signal (reset$_n$).

Said pulse generator circuit (11) may include an internal pulse generator circuit (110) and a sign selector circuit (112), wherein said internal pulse generator circuit (110) may be configured to receive said clock signal (clk) and produce a pulsed clock signal (clk') that includes a pulse following each edge of said clock signal (clk); and said sign selector circuit (112) may be configured to propagate the pulsed clock signal (clk') in response to said digital input signal (tx_com) having said second logic value and propagate the complement (clk') of the pulsed clock signal (clk') in response to said digital input signal (tx_com) having said first logic value to produce said digital transmission signal (tx_in).

Said internal pulse generator circuit (110) may include a first delay circuit block configured to receive said clock signal (clk) and propagate said clock signal (clk) with a first delay ($T_{dly1}$) to produce a first delayed clock signal (clk_dly1); a second delay circuit block configured to receive said first delayed clock signal (clk_dly1) and propagate said first delayed clock signal (clk_dly1) with a second delay ($T_{dly2}$) to produce a second delayed clock signal (clk_dly2); and an exclusive-OR gate configured to combine the first (clk_dly1) and second (clk_dly2) delayed clock signals to produce said pulsed clock signal (clk').

Said sign selector circuit (112) may include an inverter gate configured to receive said pulsed clock signal (clk') and produce the complement (clk') of the pulsed clock signal (clk'); and a multiplexer configured to pass the pulsed clock signal (clk') if said digital input signal (tx_com) has said second logic value or pass the complement (clk') of the pulsed clock signal (clk') if said digital input signal (tx_com) has said first logic value.

Logic circuit (12) may include a first mask generator circuit (122), a second mask generator circuit (124), a first control circuit (126) and a second control circuit (128), wherein the first control circuit (126) may include a first input terminal configured to receive said intermediate set signal (set_in$_n$), a second input terminal configured to receive said intermediate reset signal (reset_in$_n$), a third input terminal configured to receive a set masking signal (mask$_{set}$), a respective first delay circuit block coupled to the respective second input terminal, a respective AND logic gate configured to receive signals from the respective first input terminal and from the respective first delay circuit block, a respective second delay circuit block coupled to the output of the respective AND logic gate, a respective inverter gate coupled to the output of the respective second delay circuit block, a respective NAND logic gate configured to receive signals from the output of the respective AND gate and from the output of the respective inverter to produce a set masking control signal (cd$_{set}$) at a first output terminal of the first control circuit (126), and a respective OR logic gate configured to receive signals from the respective first input terminal and from the respective third input terminal to produce said final set signal (set$_n$) at a second output terminal of the first control circuit (126); the second control circuit (128) may include a first input terminal configured to receive said intermediate reset signal (rese_in$_n$), a second input terminal configured to receive said intermediate set signal (set_in$_n$), a third input terminal configured to receive a reset masking signal (mask$_{reset}$), a respective first delay circuit block coupled to the respective second input terminal, a respective AND logic gate configured to receive signals from the respective first input terminal and from the respective first delay circuit block, a respective second delay circuit block coupled to the output of the respective AND logic gate, a respective inverter gate coupled to the output of the respective second delay circuit block, a respective NAND logic gate configured to receive signals from the output of the respective AND gate and from the output of the respective inverter to produce a reset masking control signal (cd$_{reset}$) at a first output terminal of the second control circuit (128), and a respective OR logic gate configured to receive signals from the respective first input terminal and from the respective third input terminal to produce said final reset signal (reset$_n$) at a second output terminal of the second control circuit (128); the first mask generator circuit (122) may include a first input terminal coupled to the second output terminal of the second control circuit (128) to receive said final reset signal (reset$_n$), a second input terminal coupled to the first output terminal of the second control circuit (128) to receive said reset masking control signal (cd$_{reset}$), a respective inverter gate coupled to the respective first input terminal, and a respective set-reset flip-flop having a data input terminal (D) configured to receive a bias voltage (V$_{DD}$), a clock input terminal (C$_P$) configured to receive the signal output by the respective inverter gate, a reset input terminal (C$_D$) configured to receive said reset masking control signal (cd$_{reset}$), and a data output terminal (Q) configured to produce said set masking signal (mask$_{set}$); and the second mask generator circuit (124) may include a first input terminal coupled to the second output terminal of the first control circuit (126) to receive said final set signal (set$_n$), a second input terminal coupled to the first output terminal of the first control circuit (126) to receive said set masking control signal (cd$_{set}$), a respective inverter gate coupled to the respective first input terminal, and a respective set-reset flip-flop having a data input terminal (D) configured to receive a bias voltage (V$_{DD}$), a clock input terminal (C$_P$) configured to receive the signal output by the respective inverter gate, a reset input terminal (C$_D$) configured to receive said set masking control signal (cd$_{set}$), and a data output terminal (Q) configured to produce said reset masking signal (mask$_{reset}$).

Said output control circuit may include a set-reset flip-flop (46), the set-reset flip-flop (46) having a clock input terminal (C$_P$) driven by said final set signal (set$_n$) and a reset input terminal (C$_D$) driven by said final reset signal (reset$_n$) to produce said digital output signal (rx_com) at a data output terminal (Q) of the set-reset flip-flop (46).

The electronic device (10) may include a low-pass filter circuit (170) arranged between an output terminal of said output control circuit (46) and an output pin (106) of the electronic device (10).

The electronic device (10) may include an amplifier circuit (40) implemented on said second semiconductor die (10b), the amplifier circuit (40) being configured to receive said differential signal (Vd) and pass an amplified replica of said differential signal (Vd) to said first comparator circuit (42) and to said second comparator circuit (44).

The electronic device (10) may include a driver circuit implemented on said second semiconductor die (10b), the driver circuit may include a half-bridge circuit arranged between a positive supply voltage pin and a reference supply voltage pin and driven by said digital output signal (rx_com) to produce an output switching signal.

An electronic system may be summarized as including a processing unit and an electronic device, the processing unit being configured to generate said digital input signal (tx_com) and said clock signal (clk) received by the electronic device.

A method of transmitting a data signal across a galvanic isolation barrier, the method may be summarized as including receiving a digital input signal (tx_com) having a first frequency and a clock signal (clk) having a second frequency, wherein said second frequency is higher than said first frequency; producing a digital transmission signal (tx_in) that includes a pulse following each edge of said input digital signal (tx_com) and of said clock signal (clk), said pulse having a first polarity when said digital input signal (tx_com) has a first logic value and a second polarity when said digital input signal (tx_com) has a second logic value; producing a pair of complementary digital signals (com_p, com_n), wherein a first one (com_p) of said complementary digital signals is a replica of said digital transmission signal (tx_in), and a second one (com_n) of said complementary digital signals is the complement of said digital transmission signal (tx_in); propagating said first complementary digital signal (com_p) through a first capacitor (103P) and said second complementary digital signal (com_n) through a second capacitor (103N), whereby it is produced a differential signal (Vd) that includes a spike of a first polarity at each rising edge of said digital transmission signal (tx_in) and a spike of a second polarity at each falling edge of said digital transmission signal (tx_in); producing an intermediate set signal (set_in$_n$) that includes a pulse at each spike of said differential signal (Vd) having said first polarity; producing an intermediate reset signal (reset_in$_n$) that includes a pulse at each spike of said differential signal (Vd) having said second polarity; producing a final set signal (set$_n$) by activating masking (mask$_{set}$) of said intermediate set signal (set_in$_n$) in response to a pulse of said intermediate reset signal (reset_in$_n$), and de-activating masking (mask$_{set}$) of said intermediate set signal (set_in$_n$) in response to the end of a pulse of said intermediate set signal (set_in$_n$) or in response to a time interval (T$_{dly3}$) elapsing after a pulse of said intermediate reset signal (reset_in$_n$); producing a final reset signal (reset$_n$) by activating masking (mask$_{reset}$) of said intermediate reset signal (reset_in$_n$) in response to a pulse of said intermediate set signal (set_in$_n$), and de-activating masking (mask$_{reset}$) of said intermediate reset signal (reset_in$_n$) in response to the end of a pulse of said intermediate reset signal (reset_in$_n$) or in response to a time interval (T$_{dly3}$) elapsing after a pulse of said intermediate set signal (set_in$_n$); and asserting a digital output signal (rx_com) in response to a pulse being detected in said final set signal (set$_n$) and de-asserting said digital output signal (rx_com) in response to a pulse being detected in said final reset signal (reset$_n$).

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic device, comprising:
a first semiconductor die and a second semiconductor die;
a pulse generator circuit implemented on said first semiconductor die, the pulse generator circuit being configured to receive a digital input signal having a first frequency and a clock signal having a second frequency, wherein said second frequency is higher than said first frequency, the pulse generator circuit being further configured to produce a digital transmission signal that includes a pulse following each edge of said input digital signal and of said clock signal, said pulse having a first polarity when said digital input signal has a first logic value and a second polarity when said digital input signal has a second logic value;
a transmitter circuit implemented on said first semiconductor die, the transmitter circuit being configured to receive said digital transmission signal and to produce a pair of complementary digital signals, wherein a first one of said complementary digital signals is a replica of said digital transmission signal and is produced at a first output node of said transmitter circuit, and a second one of said complementary digital signals is the complement of said digital transmission signal and is produced at a second output node of said transmitter circuit;
a galvanic isolation barrier implemented on said first semiconductor die or on said second semiconductor die, the galvanic isolation barrier including a first capacitor having a first terminal coupled to the first output node of said transmitter circuit and a second capacitor having a first terminal coupled to the second output node of said transmitter circuit, whereby a differential signal is produced between a second terminal of said first capacitor and a second terminal of said second capacitor, the differential signal including a spike of a first polarity at each rising edge of said digital transmission signal and a spike of a second polarity at each falling edge of said digital transmission signal;
a first comparator circuit implemented on said second semiconductor die, the first comparator circuit being configured to receive said differential signal and to produce an intermediate set signal that includes a pulse at each spike of said differential signal having said first polarity;
a second comparator circuit implemented on said second semiconductor die, the second comparator circuit being configured to receive said differential signal and to produce an intermediate reset signal that includes a pulse at each spike of said differential signal having said second polarity;
a logic circuit implemented on said second semiconductor die, the logic circuit being configured to receive said intermediate set signal and said intermediate reset signal, and further configured to:
produce a final set signal by activating masking of said intermediate set signal in response to a pulse of said intermediate reset signal, and de-activating masking of said intermediate set signal in response to the end of a pulse of said intermediate set signal or in response to a time interval elapsing after a pulse of said intermediate reset signal; and
produce a final reset signal by activating masking of said intermediate reset signal in response to a pulse of said intermediate set signal, and de-activating masking of said intermediate reset signal in response to the end of a pulse of said intermediate reset signal or in response to a time interval elapsing after a pulse of said intermediate set signal; and
an output control circuit implemented on said second semiconductor die, the output control circuit being configured to receive said final set signal and said final reset signal, and further configured to assert a digital output signal in response to a pulse being detected in said final set signal and de-assert said digital output signal in response to a pulse being detected in said final reset signal.

2. The electronic device of claim 1, wherein said pulse generator circuit includes an internal pulse generator circuit and a sign selector circuit, wherein:
said internal pulse generator circuit is configured to receive said clock signal and produce a pulsed clock signal that includes a pulse following each edge of said clock signal; and
said sign selector circuit is configured to propagate the pulsed clock signal in response to said digital input signal having said second logic value and propagate the complement of the pulsed clock signal in response to said digital input signal having said first logic value to produce said digital transmission signal.

3. The electronic device of claim 2, wherein said internal pulse generator circuit includes:
a first delay circuit block configured to receive said clock signal and propagate said clock signal with a first delay to produce a first delayed clock signal;
a second delay circuit block configured to receive said first delayed clock signal and propagate said first delayed clock signal with a second delay to produce a second delayed clock signal; and
an exclusive-OR gate configured to combine the first and second delayed clock signals to produce said pulsed clock signal.

4. The electronic device of claim 2, wherein said sign selector circuit includes:
an inverter gate configured to receive said pulsed clock signal and produce the complement of the pulsed clock signal; and
a multiplexer configured to pass the pulsed clock signal if said digital input signal has said second logic value or pass the complement of the pulsed clock signal if said digital input signal has said first logic value.

5. The electronic device of claim 1, wherein logic circuit includes a first mask generator circuit, a second mask generator circuit, a first control circuit and a second control circuit, wherein:
the first control circuit includes a first input terminal configured to receive said intermediate set signal, a second input terminal configured to receive said intermediate reset signal, a third input terminal configured to receive a set masking signal, a respective first delay circuit block coupled to the respective second input terminal, a respective AND logic gate configured to receive signals from the respective first input terminal and from the respective first delay circuit block, a respective second delay circuit block coupled to the output of the respective AND logic gate, a respective inverter gate coupled to the output of the respective second delay circuit block, a respective NAND logic gate configured to receive signals from the output of the respective AND gate and from the output of the respective inverter to produce a set masking control signal at a first output terminal of the first control circuit, and a respective OR logic gate configured to receive signals from the respective first input terminal and from the respective third input terminal to produce said final set signal at a second output terminal of the first control circuit;

the second control circuit includes a first input terminal configured to receive said intermediate reset signal, a second input terminal configured to receive said intermediate set signal, a third input terminal configured to receive a reset masking signal, a respective first delay circuit block coupled to the respective second input terminal, a respective AND logic gate configured to receive signals from the respective first input terminal and from the respective first delay circuit block, a respective second delay circuit block coupled to the output of the respective AND logic gate, a respective inverter gate coupled to the output of the respective second delay circuit block, a respective NAND logic gate configured to receive signals from the output of the respective AND gate and from the output of the respective inverter to produce a reset masking control signal at a first output terminal of the second control circuit, and a respective OR logic gate configured to receive signals from the respective first input terminal and from the respective third input terminal to produce said final reset signal at a second output terminal of the second control circuit;

the first mask generator circuit includes a first input terminal coupled to the second output terminal of the second control circuit to receive said final reset signal, a second input terminal coupled to the first output terminal of the second control circuit to receive said reset masking control signal, a respective inverter gate coupled to the respective first input terminal, and a respective set-reset flip-flop having a data input terminal configured to receive a bias voltage, a clock input terminal configured to receive the signal output by the respective inverter gate, a reset input terminal configured to receive said reset masking control signal, and a data output terminal configured to produce said set masking signal; and the second mask generator circuit includes a first input terminal coupled to the second output terminal of the first control circuit to receive said final set signal, a second input terminal coupled to the first output terminal of the first control circuit to receive said set masking control signal, a respective inverter gate coupled to the respective first input terminal, and a respective set-reset flip-flop having a data input terminal configured to receive a bias voltage, a clock input terminal configured to receive the signal output by the respective inverter gate, a reset input terminal configured to receive said set masking control signal a data output terminal configured to produce said reset masking signal.

6. The electronic device of claim 1, wherein said output control circuit includes a set-reset flip-flop, the set-reset flip-flop having a clock input terminal driven by said final set signal and a reset input terminal driven by said final reset signal to produce said digital output signal at a data output terminal of the set-reset flip-flop.

7. The electronic device of claim 1, comprising a low-pass filter circuit arranged between an output terminal of said output control circuit and an output pin of the electronic device.

8. The electronic device of claim 1, comprising an amplifier circuit implemented on said second semiconductor die, the amplifier circuit being configured to receive said differential signal and pass an amplified replica of said differential signal to said first comparator circuit and to said second comparator circuit.

9. The electronic device of claim 1, comprising a driver circuit implemented on said second semiconductor die, the driver circuit including a half-bridge circuit arranged between a positive supply voltage pin and a reference supply voltage pin and driven by said digital output signal to produce an output switching signal.

10. A device, comprising:
a galvanic isolation barrier having a first capacitor and a second capacitor;
a first semiconductor die including:
a pulse generator circuit having a first input, a second input, and an output;
a transmitter circuit having an input coupled to the output of the pulse generator circuit, a first output coupled to a first terminal of the first capacitor, and a second output coupled to a first terminal of the second capacitor;
a second semiconductor die including:
a first comparator having a first input coupled to a second terminal of the first capacitor and a second input coupled to a second terminal of the second capacitor;
a second comparator having a first input coupled to the second terminal of the first capacitor and a second input coupled to the second terminal of the second capacitor;
a logic circuit having a first input coupled to an output of the first comparator and a second input coupled to an output of the second comparator; and
an output control circuit having an input coupled to an output of the logic circuit.

11. The device of claim 10, wherein the galvanic isolation barrier is implemented in either the first semiconductor die or the second semiconductor die.

12. The device of claim 11, wherein the second semiconductor die includes an amplifier circuit coupled between the galvanic isolation barrier and the first and second comparator circuits.

13. The device of claim 11, wherein the output control outputs a digital control signal.

* * * * *